United States Patent [19]

Akamatsu

[11] Patent Number: 5,264,984
[45] Date of Patent: Nov. 23, 1993

[54] COOLING SYSTEM FOR A PACKAGE WITH ELECTRONIC CIRCUIT COMPONENTS

[75] Inventor: Shinya Akamatsu, Tokyo, Japan
[73] Assignee: NEC Corporation, Tokyo, Japan
[21] Appl. No.: 41,315
[22] Filed: Mar. 31, 1993

[30] Foreign Application Priority Data

Apr. 6, 1992 [JP] Japan .............................. 4-083782

[51] Int. Cl.⁵ .............................................. H05K 7/20
[52] U.S. Cl. ................................... 361/689; 165/80.4;
    165/185; 174/16.3; 257/714; 257/719; 361/699
[58] Field of Search ................. 165/80.4, 104.33, 185;
    174/16.3; 257/714, 716, 718–719; 361/381–382,
    385–389

[56] References Cited

U.S. PATENT DOCUMENTS

| | | | |
|---|---|---|---|
| 4,882,654 | 11/1989 | Nelson et al. | 361/382 |
| 4,940,085 | 7/1990 | Nelson et al. | 361/385 |
| 5,050,037 | 9/1991 | Yamamoto et al. | 361/385 |
| 5,166,863 | 11/1982 | Shmunis | 361/385 |

OTHER PUBLICATIONS

S. Oktay et al, "A Conduction-Cooled Module for High-Performance LSI Devices", IBM J. Res. Develop., vol. 26, No. 1, Jan., 1982, pp. 55–66.

*Primary Examiner*—Gergory D. Thompson
*Attorney, Agent, or Firm*—Sughrue, Mion, Zinn, Macpeak & Seas

[57] ABSTRACT

A cooling system for cooling electronic circuit components mounted on a wiring substrate includes containers placed on the respective components, and nozzles each having a central through-hole and peripheral through-holes. The outer bottom surface of each container is in good thermal contact with a corresponding electronic circuit component. Each nozzle is inserted into a corresponding container so that first ends of the central and peripheral through-holes of the nozzle are positioned within the container, while the opposite ends are positioned outside the container. The gap between the inner side wall of each container and the outer side surface of a nozzle inserted into the container is hermetically sealed by a sealing member. Liquid coolant is supplied through the central through-hole of each container into the container and then discharged through the peripheral through-holes to a location outside the container.

12 Claims, 4 Drawing Sheets

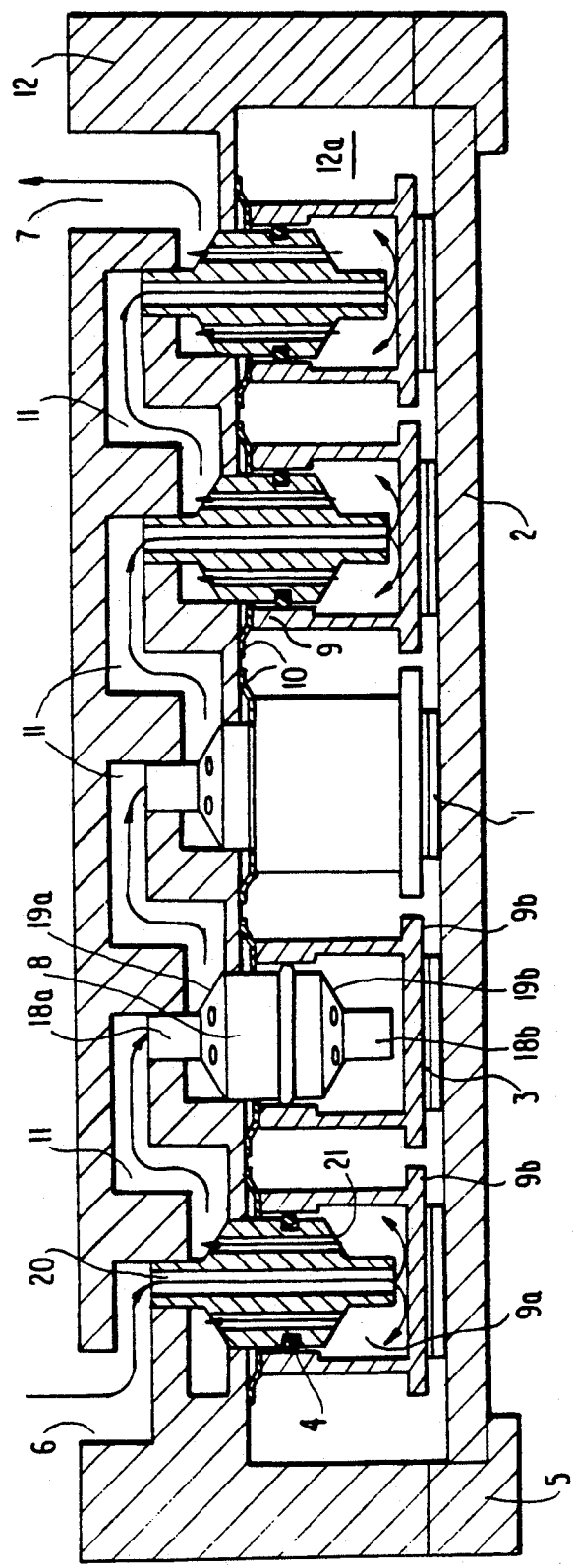

COOLING SYSTEM FOR A PACKAGE WITH ELECTRONIC CIRCUIT COMPONENTS

BACKGROUND OF THE INVENTION

The invention relates to a cooling system for a package in which electronic circuit components are mounted on a wiring substrate.

A prior art cooling system of this type is disclosed in a paper entitled "A Conduction-Cooled Module for High-Performance LSI Devices" by S. Oktay and H. C. Kammerer, published in the IBM J. RES. DEVELOP. Vol. 26, No. 1, pp. 55–66, January, 1982. The module disclosed in FIG. 1 in the paper comprises a multi-layer ceramic substrate, semiconductor chips mounted on the substrate, a hat covering the substrate, cavities formed in the hat, pistons resting in the cavities, springs pressing the pistons against the chips, helium gas filling a space defined by the substrate and the hat, a cold plate through which water flows, and an interposer inserted between the cold plate and the hat. In the module, heat generated from the chips is conducted to the cold plate through the pistons, the helium gas, the hat and the interposer. The module has a thermal-conduction coefficient of no more than 0.1 to 0.5 W/cm$^{2\circ}$ C. because of a small effective area for thermal conduction. As a result, the module has a disadvantage in that its cooling capacity becomes insufficient to cool integrated circuit chips as the chips come to consume more power with increasing circuit densities in the chips.

Another prior art cooling system is disclosed in U.S. Pat. No. 5,050,037. The system comprises a printed circuit board assembly having a printed circuit board 22, heat generative electronic circuit components 26 mounted on both faces of the board 22, and a pair of liquid-cooling modules 30a and 30b arranged on both sides of the board 22. Each of the modules 30a and 30b is provided with a liquid-cooling plate 32 having coolant supply heads 36 and resilient heat transfer units 40 held by the plate 32 and arranged in compressive contact with the components 26 on both faces of the board 22. Each of the heat transfer units 40 has a hollow resilient member 42 constructed as a bellows which must have an appropriate resiliency sufficient to ensure a stable contact between the unit 40 and the component 26 while absorbing any slight differences in the heights of the components 26. To gain a sufficient resiliency, the resilient member 42 is required to be formed thinly, resulting in a disadvantage in that liquid coolant flowing through the heat transfer unit 40 may leak out since the resilient member 42 is apt to easily develop a hole caused by erosion because of its thinness.

SUMMARY OF THE INVENTION

An object of the present invention is therefore to provide a cooling system free from the disadvantages of the above-mentioned prior art cooling systems.

According to an aspect of the invention, there is provided a cooling system for electronic circuit components.

The cooling system comprises a substrate on which the electronic circuit components are mounted, containers placed on the electronic circuit components, respectively, and nozzles each having at least one, first through-hole and at least one, second through-hole and being inserted into a corresponding one of the containers so that first ends of the first and second through-holes are positioned within the corresponding one of the containers, while the opposite ends of the first and second through-holes are positioned outside the corresponding one of the containers. The cooling system further comprises sealing members each hermetically sealing the gap between the inner side wall of a corresponding one of the containers and the outer side surface of a corresponding one of the nozzles inserted thereinto, pressing means for pushing the containers toward the electronic circuit components so as to bring the outer bottom surfaces of the containers into good thermal contact with the electronic circuit components, and coolant routing means for supplying coolant into each of the containers through the first through-hole thereof and discharging the coolant outside each of the containers through the second through-hole thereof.

BRIEF DESCRIPTION OF THE DRAWINGS

Other features and advantages of the invention will become apparent from the following detailed description when taken in conjunction with the accompanying drawings, in which:

FIG. 4 is a cross-sectional view of a second embodiment of the invention; and

In the drawings, the same reference numerals represent the same structural elements.

DETAILED DESCRIPTION OF THE PREFERRED EMBODIMENTS

Description will next be made with respect to a first embodiment of the invention in detail.

Figure 1:
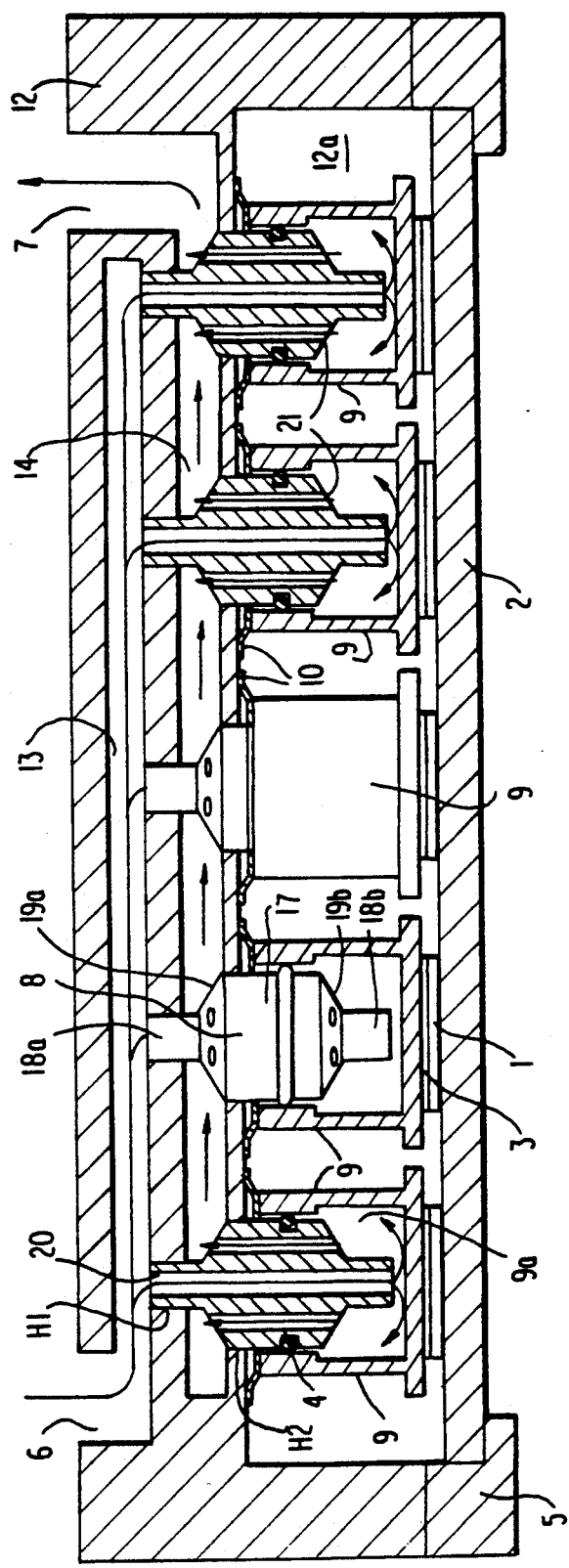
FIG. 1 is a cross-sectional view of a first embodiment of the invention.

Referring to FIG. 1, a first embodiment of the invention comprises electronic circuit components 1 such as integrated circuit chips, and a wiring substrate 2 on which the components 1 are mounted. A support frame 5 surrounds the periphery of the substrate 2 to support it. Cover means in the form of a cover frame 12 covers the components 1 and the upper surface of the substrate 2 so as to form a space 12a defined by the upper surface of the substrate 2 and the inner side and bottom surfaces of the frame 12. A plurality of cylindrical cooling containers 9 are arranged in the space 12a in alignment with the respective associated components 1, and nozzles 8 are located within the respective associated containers 9.

First and second channels 13 and 14 are formed between the inner and outer surfaces of the frame 12. The outer surface of the frame 12 has a coolant inlet 6 connecting to the first channel 13 and a coolant outlet 7 connecting to the second channel 14, thereby to form coolant routing means.

Figure 2A:
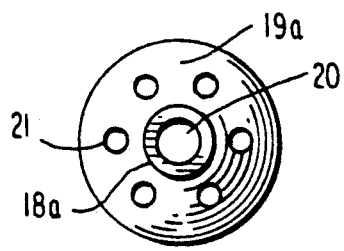
FIGS. 2A, 2B and 2C show top plan, side and cross-sectional views of a nozzle 8, respectively.
Figure 2B:
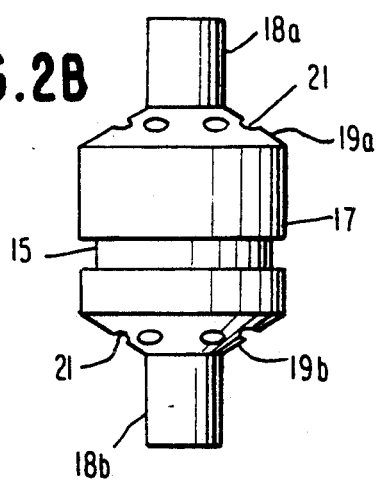
Figure 2C:
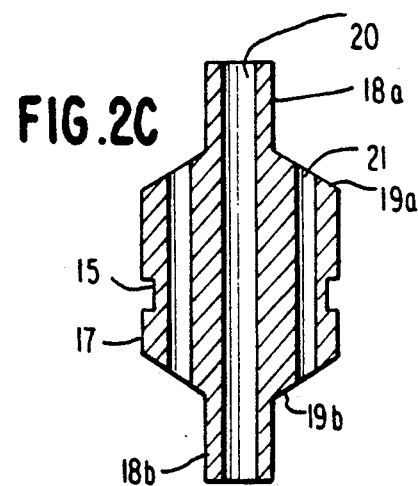

FIGS. 2A, 2B and 2C show top plan, side and cross-sectional views of one of the nozzles 8, respectively. The nozzle 8 is made of stainless steel and is cylindrical at its middle portion 17 and opposite end portions 18a and 18b. The outer diameter of the middle portion 17 is larger than those of the end portions 18a and 18b. A tapered portion 19a is formed toward the end portion 18a from the middle portion 17 and a tapered portion 19b is formed toward the end portion 18b from the middle portion 17. The nozzle 8 further has a groove 15 extending around the middle portion 17, a central through-hole 20 penetrating from the end portion 18a to the end portion 18b, and peripheral through-holes 21 penetrating from the tapered portion 19a to the tapered portion 19b (see FIG. 2C).

Turning back to FIG. 1, the end portions 18a of the nozzles 8 are inserted in respective associated first holes $H_1$ extending from the channel 13 to the channel 14 while the middle portions 17 of the nozzles 8 are inserted in respective associated second holes $H_2$ extending from the channel 14 to the space 12a. Consequently, the tapered portions 19a of the nozzles 8 are positioned within the second channel 14. The nozzles 8 are fixed to the cover frame 12 at these first and second holes by any suitable means such as brazing. Each first hole $H_1$ and the associated second hole $H_2$ are arranged in alignment with the associated component 1.

The containers 9 made of copper are placed above the associated components and an elastic heat conductive member 3 is interposed between the outer bottom surface of each container 9 and the upper surface of the associated component. The inner diameter of each container 9 is slightly larger than the outer diameter of the middle portion 17 of each nozzle 8. An elastic O-ring 4 made of silicone rubber is attached to the groove 15 of each nozzle 8, and the nozzle 8 is inserted into the associated container 9 with the O-ring 4 in compressive contact with the inner side wall of the container 9. As a result, a space 9a is formed by the portions 18b and 19b of the nozzle 8, the O-ring 4, and the side wall and bottom surface of the container 9, and is hermetically sealed by the O-ring 4.

Figure 3A:
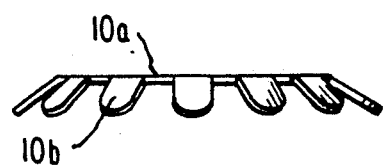
FIGS. 3A and 3B are side and top plan views of a circular spring 10, respectively.
Figure 3B:
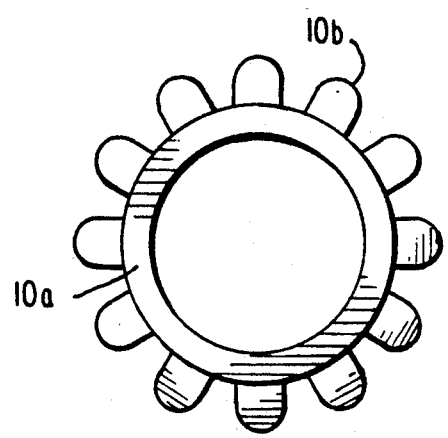

Between the inner bottom surface of the frame 12 and the upper edge of each container 9 is a gap in which pressing means in the form of a circular spring 10 is inserted. As shown in FIGS. 3A and 3B, the spring 10 consists of a ring portion 10a and fin portions 10b extending radially outwardly and downwardly from the ring portion 10a. The ring portion 10a is engaged with the upper edge of the container 9, while the tips of the fin portions 10b are in contact with the inner bottom surface of the frame 12 (see FIG. 1). In that state, the container 9 is pressed against the elastic heat conductive member 3 with the elasticity of the fin portions 10b of the spring 10.

The frames 5 and 12, which are made of aluminum and stainless steel, respectively, are secured by fixing means such as screws (not shown).

Liquid coolant such as water or fluorocarbon is supplied into the channel 13 from the inlet 6. The supplied coolant passes through the central through-holes 20 of the nozzles 8 and impinges on the inner bottom surfaces of the containers 9. Heat conducted from the components 1 to the containers 9 is taken away from the inner bottom surfaces of the containers 9 by the impinging coolant. The coolant heated by the heat subsequently flows through the peripheral through-holes 21 of the nozzles 8 into the channel 14, and is discharged from the outlet 7 (see FIG. 1).

FIG. 4 shows a second embodiment of the invention. The construction of the second embodiment is basically the same as that of the first embodiment. In the second embodiment, liquid coolant fed from the coolant inlet 6 flows into only the central through-hole 20 of the first one of the nozzles 8, as compared with the structure in the first embodiment in which the coolant supplied from the inlet 6 flows into the central through-holes 20 of all the nozzles 8, directly. The coolant runs through the central through-hole 20 of the first nozzle into the space 9a of the first nozzle in which heat generated by the associated component 1 is taken away by the coolant. Thereafter, the coolant flows through the peripheral through-holes 21 of the first nozzle into a channel 11 connected to the central through-hole 20 of only the second one of the nozzles 8. In this manner, the coolant fed from the inlet 6 runs from the first nozzle to the last one in sequence or series through the channels 11, each of which links the peripheral through-holes of a previous nozzle to the central through-hole of the next nozzle, and is discharged from the coolant outlet 7.

Figure 5:
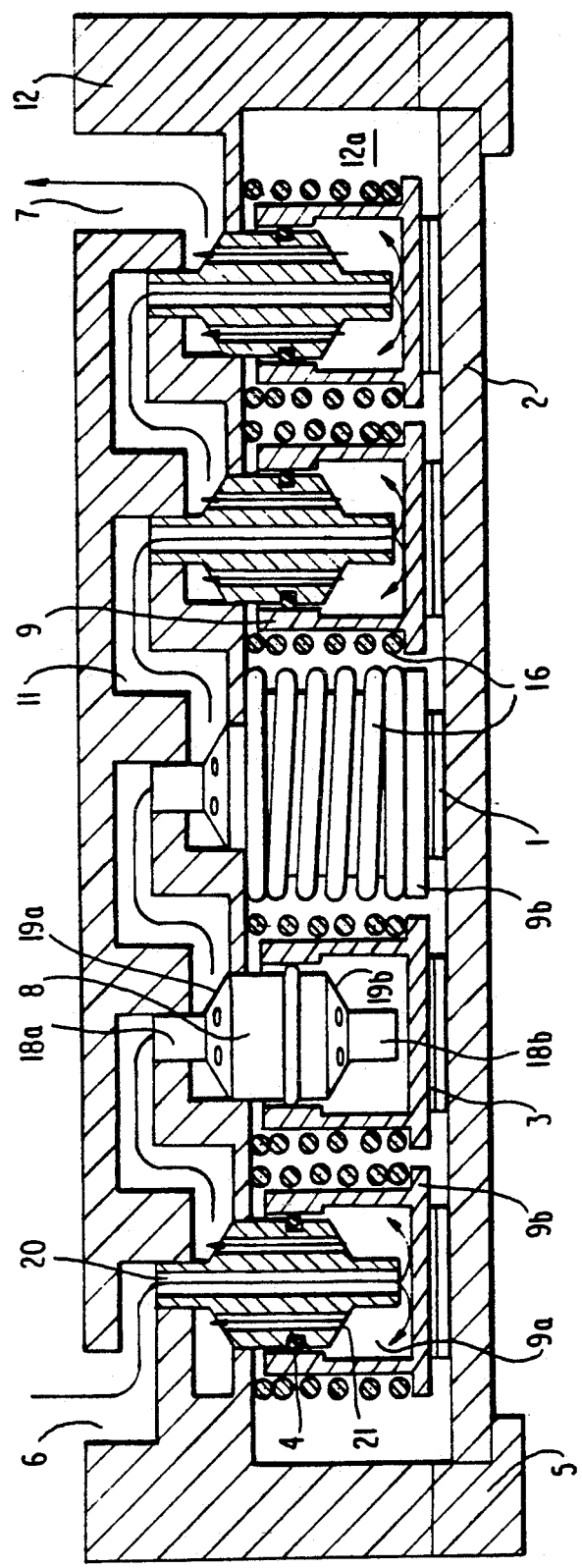
FIG. 5 is a cross-sectional view of a third embodiment of the invention.

FIG. 5 shows a third embodiment of the invention. The construction of the third embodiment is the same as that of the second embodiment with the exception that the circular springs 10 in the second embodiment are replaced with coil springs 16 and that a flange 9b is formed around the bottom of each container 9. The containers 9 are inserted into the coil springs 16 from first ends of the coil springs 16 until the flanges 9b reach the first ends of the springs 16. The other ends of the coil springs 16 are in contact with the inner bottom surface of the cover frame 12. In that state, the springs 16 are compressed between the flanges 9b and the inner bottom surface of the frame 12, with the elastic heat conductive members 3 in compressive contact with the outer bottom surfaces of the containers 9.

Although the present invention has been fully described by way of the preferred embodiments thereof with reference to the accompanying drawings, various changes and modifications will be apparent to those having skill in this field. Therefore, unless these changes and modifications otherwise depart from the scope of the present invention, they should be construed as included therein.

What is claimed is:

1. A cooling system for electronic circuit components, said cooling system comprising:
 a substrate on which said electronic circuit components are mounted;
 a plurality of containers placed on said electronic circuit components, respectively, each of said containers including a side wall and a bottom;
 a plurality of nozzles, each of said nozzles having at least one, first through-hole and at least one, second through-hole and being inserted into a corresponding one of said containers so that first ends of said first and second through-holes are positioned within said corresponding one of said containers, while opposite, second ends of said first and second through-holes are positioned outside said corresponding one of said containers, each of said nozzles including an outer side surface and there being a gap formed between the outer side surface and an inner portion of the side wall of a corresponding one of said containers;
 sealing members each hermetically sealing the gap between the inner portion of the side wall of a corresponding one of said containers and the outer side surface of a corresponding one of said nozzles inserted thereinto;
 pressing means for pushing said containers toward said electronic circuit components so as to bring outer surfaces of the bottoms of said containers into thermal contact with said electronic circuit components; and coolant routing means for supplying coolant into each of said containers through said first through-hole thereof and discharging said coolant outside each of said containers through said second through-hole thereof.

2. The cooling system as claimed in claim 1, further comprising cover means to which said nozzles are fixed.

3. The cooling system as claimed in claim 2, wherein said coolant routing means is provided in said cover means and includes:
   a coolant inlet;
   a first channel linking said coolant inlet to said first through-hole of each of said nozzles to supply coolant from said coolant inlet into said containers;
   a coolant outlet; and
   a second channel linking said coolant outlet to said second through-hole of each of said nozzles to discharge said coolant in said containers from said coolant outlet.

4. The cooling system as claimed in claim 2, wherein said coolant routing means is provided in said cover means and includes:
   a plurality of channels each of which links said second through-hole of one of said nozzles to said first through-hole of another one of said nozzles following said one of said nozzles;
   a coolant inlet for supplying coolant into said first through-hole of the first one of said nozzles; and
   a coolant outlet for discharging coolant flowing out through said second through-hole of the last one of said nozzles.

5. The cooling system as claimed in claim 1, wherein each of said electronic circuit components comprises a component body and an elastic member of high thermal-conductivity placed on said component body.

6. The cooling system as claimed in claim 2, wherein said containers include upper ends and wherein said pressing means consists of springs interposed between said cover means and the upper ends of said containers.

7. The cooling system as claimed in claim 6, wherein each of said springs consists of a frame portion and fin portions extending radially outwardly and downwardly from said frame portion.

8. The cooling system as claimed in claim 2, wherein
   a flange is formed around the bottom of each of said containers and perpendicular to the side wall thereof; and
   said pressing means consists of coil springs each interposed between said cover means and said flange.

9. The cooling system as claimed in claim 1, wherein each of said nozzles comprises:
   a middle portion shaped cylindrically;
   first and second end portions shaped cylindrically, outer diameters of which are smaller than that of said middle portion;
   a first tapered portion formed toward said first end portion from said middle portion; and
   a second tapered portion formed toward said second end portion from said middle portion.

10. The cooling system as claimed in claim 9, wherein said first through-hole penetrates from said first end portion to said second end portion, and said second through-hole penetrates from said first tapered portion to said second tapered portion.

11. The cooling system as claimed in claim 10, wherein
   a diameter of each of said containers is slightly larger than an outer diameter of said middle portion of each of said nozzles;
   each of said nozzles has a groove extending around said middle portion; and
   each of said sealing members consists of an O-ring and is attached to said groove.

12. The cooling system as claimed in claim 1, wherein said electronic circuit components are integrated circuit chips.

* * * * *

UNITED STATES PATENT AND TRADEMARK OFFICE
CERTIFICATE OF CORRECTION

PATENT NO. : 5,264,984
DATED : November 23, 1993
INVENTOR(S) : Shinya Akamatsu

It is certified that error appears in the above-identified patent and that said Letters Patent is hereby corrected as shown below:

Col. 3, line 20, after "components" insert --1,--.

Col. 3, line 23, after "component" insert --1--.

Signed and Sealed this

Twenty-first Day of June, 1994

*Attest:*

BRUCE LEHMAN

*Attesting Officer*     *Commissioner of Patents and Trademarks*